United States Patent [19]

Skilling

[11] 4,342,959

[45] Aug. 3, 1982

[54] METHOD OF ELECTRICAL SHORT TESTING AND THE LIKE

[75] Inventor: James K. Skilling, Harvard, Mass.

[73] Assignee: GenRad, Inc., Concord, Mass.

[21] Appl. No.: 258,762

[22] Filed: Apr. 29, 1981

Related U.S. Application Data

[63] Continuation of Ser. No. 51,204, Jun. 22, 1979, abandoned.

[51] Int. Cl.³ .............................................. G01R 15/12
[52] U.S. Cl. ............................... 324/73 PC; 324/73 R; 324/158 T
[58] Field of Search ............ 324/51, 62, 73 PC, 73 R, 324/73 AT, 158 T, DIG. 1; 364/552

[56] References Cited

U.S. PATENT DOCUMENTS

| | | | |
|---|---|---|---|
| 3,441,849 | 4/1969 | Bennett et al. | 324/73 R |
| 3,492,571 | 1/1970 | Desler | 324/73 R |
| 3,528,104 | 9/1970 | Ehlschager | 324/51 |
| 3,784,910 | 1/1974 | Sylvan | 324/73 AT |
| 4,114,093 | 9/1978 | Long | 324/73 AT |

OTHER PUBLICATIONS

"The Smart Probe-A New Diagnostic Tool", Test Systems Division Application Note 1, General Radio Co. (now GenRad, Inc.), Aug. 1975.
"Automatic Fault Location Using On-Line Simulation", Haas, et al., General Radio brochure B-28, 1974.

Primary Examiner—David K. Moore
Attorney, Agent, or Firm—Rines and Rines, Shapiro and Shapiro

[57] ABSTRACT

This disclosure is concerned with a process for connecting a short detector to electrical nodes in such apparatus as backplanes, cables, and circuit boards, before and after component assembly, to identify shorted node pairs in a substantially smaller number of tests than required by previously known methods, through a novel series of tests between each node and all other nodes, taken together, so as to identify shorted nodes, and then a series of tests between each of these shorted nodes and all other shorted nodes, taken individually, to identify the shorted node pairs.

4 Claims, 1 Drawing Figure

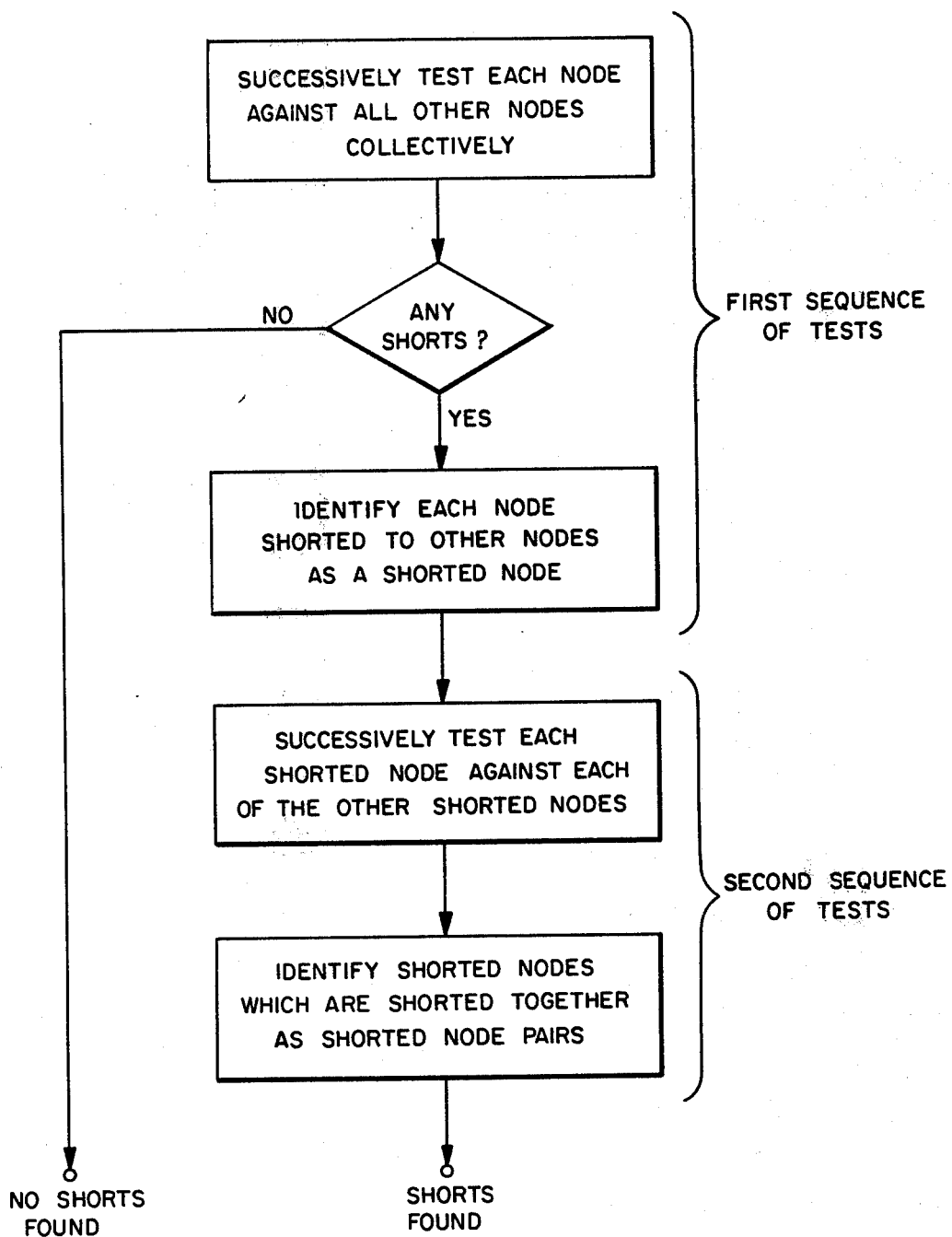

METHOD OF ELECTRICAL SHORT TESTING AND THE LIKE

This application is a continuation application of Ser. No. 51,204, filed June 22, 1979, now abandoned.

The present invention relates to methods of detecting electrical shorts and the like in electrical and electronic circuit boards, backplanes, cables and similar systems, being more particularly directed to techniques for achieving significant reduction in number of testing connections to electrical nodes required to find the fault—specifically, the shorted node pairs; and, from methodology considerations, being applicable, also, to other types of systems, including in other fields of applications, as well, having similar or analogous operational considerations.

In present-day technology for the manufacturing of electrical or electronic circuits and the like, the difficulty of producing such circuits without faults is mounting as the circuits are radically miniaturized and subminiaturized, and the complexity and multifunctions of the components thereof are strikingly increased. Manufacturers must test such circuit assemblies not only to insure that components have been placed in the circuit properly and have not been damaged in assembly, but also to determine that the circuit as a whole functions properly. The art has struggled over the years to provide more efficient and higher speed testing for such circuits. The object of such testing, should a fault be discovered, is to pinpoint the locations of the fault so that the newly-manufactured circuit can be quickly repaired and made functional. Sophisticated computer-aided techniques for the purpose have been developed such as the CAPS system of GenRad, Inc., the assignee of the present application, as described, for example in "Automatic Fault Location Usng On-Line Simulation", Rene, Haas, Lutz, Henckels and David Schneider, Technical Paper Presented at the Institute of Electrical and Electronics Engineers International Convention and Exposition "Intercon 74", Mar. 26-29, 1974. Another technique for improving test and diagnosis process involves manual probing and is described in "The Smart Probe-A New Diagnostic Tool," Test Systems Systems Division Application Note 1, General Radio Co. (now GenRad, Inc.) August, 1975.

A prevalent type of fault in today's technology is the unwanted short between two nodes of a circuit. Such shorts can be detected and located with much simpler techniques than the sophisticated methods mentioned above. Such sophisticated testing is, of course, obscured and slowed by the presence of shorts between nodes. Testing efficiency can be improved, therefore, if such shorts can be detected and removed before the sophisticated testing process is begun.

Although such shorts testing may prove a piece of equipment defective, however, it is of little value in indicating how the equipment can be repaired unless the nodes shorted together can be identified; so that the object of shorts testing is not only to detect the presence of shorts, but to identify the shorted nodes.

Testing for shorts is needed also in the manufacture of other electrical devices such as cables, backplanes, bare circuit boards, etc., and other types of apparatus, as well.

In accordance with the present invention, a technique has been evolved that departs rather radically from the testing connection philosophy developed through the years and enables vast reduction in number of required tests and time for short or related fault identification. It is in order, however, before describing the prior art and contrasting the same from the invention, to provide definitions of terms as used herein.

In connection with the application of the invention to the electrical field, the generic term "node" is used herein to connote an isolated electrical conductor or connection point; the same concept applying to analogous points of similar systems in other than the electrical field. The word "short" connotes the (generally unwanted) presence of a shortcircuit or, more generically, of an electrical resistance between two nodes of less than some preselected value. A "short detector" is apparatus having at least two connection leads which, when connected respectively to two nodes or groups of nodes, can detect the presence of a short between those nodes or groups of nodes.

In the prior art of shorts testing, various straightforward techniques have been employed. The most thorough of these is to test each node pair separately. The first node is tested against the second, then the third, etc., and then the second node is tested against the third, then the fourth, etc., until finally the $(N-1)$th node is tested against the Nth. This requires $(N-1)+(N-2)+(N-3)+ \ldots +3+2+1$ or $\frac{1}{2}(N^2-N)$ shorts tests. Because this number is of the order of magnitude of $N^2$, this method might be called the "N-Squared Test". When the number of nodes is large, this requires a very large number of shorts tests.

A modification of the above is the "Terminating N-Squared Test" which is identical to the "N-Squared Test" except that if a connection is found, further tests with the present first node of the pair are not executed. The connection to the first node is, rather moved to the next; and testing continues.

For example, if node 4 is found to be shorted to node 5, further testing with node 4 is discontinued and testing continues with node 5. If node 4 is shorted to some other higher-numbered node, say 7, node 5 will be also. It is impossible to determine whether 4 is shorted to 5 and also to 7, or whether 4 is shorted to 7 which is shorted to 5, etc. When, and only when shorts are present, this technique requires fewer tests than the N-Squared Test, and again shorted nodal pairs or groups are completely identified.

In further searching for methods of reducing the number of tests required for testing assemblies with large numbers of nodes, some manufacturers have used what might be called the "Linear Test". In this technique, each node is tested individually against all others, collectively. For N nodes, N tests are required. When shorted nodes are found, it is not determined to which other nodes they are shorted. This reduced amount of information is acceptable, in some cases, in return for the greatly reduced number of shorts tests required.

An object of the present invention, however, is to provide a new and vastly improved process or method of short detection and the like that enables testing for and identifying all node pairs which are shorted; and does so with a significantly smaller number of tests than is required by any of the above-described previously known methods.

The invention is thus particularly useful for testing any multiplicity of electrical nodes, such as multi-conductor cables, backplanes, and printed circuit boards, both before and after component parts are assembled thereto, and similar devices.

Another object of the invention is to provide a novel short or similar fault detector of more general utility, as well.

Other and further objects will be explained hereinafter and are more particularly delineated in the appended claims.

In summary, from one of its broadest aspects, the invention embraces a method of detecting shorts and the like between a pair of leads, that comprises, connecting one lead successively to each individual node of a plurality of nodes in apparatus under test; during the connection of said one lead to each such node individually, connecting the other lead to all of the remaining nodes of said plurality of nodes collectively; identifying during said connecting those nodes which are shorted to one or more other nodes between the leads; and thereupon connecting each thusly identified shorted node to one of the pair of leads while connecting the other lead successively to each of the other identified shorted nodes; and indicating when a shorted node pair is thus detected. Preferred or best mode details are hereinafter presented.

The single FIGURE is a flow chart illustrating an electrical short testing method in accordance with the invention.

Since the primary thrust of the invention lies in the novel method or process in which conventional apparatus may be adapted to be used to effect a dramatic improvement in the efficiency of the shorts testing process, it is not believed that drawings are necessary to illustrate such known short detector apparatus with two leads and switch connections to nodes or groups of nodes. Two well-known realizations of such apparatus, are an ohmmeter, which actually measures resistance, and well-known means for comparing the measured value against a preselected value; or a conventional bridge circuit in which one of the four arms of the bridge is the device being tested, accessed at the nodes or groups of nodes being tested at that moment, with the direction of unbalance of the bridge indicating immediately whether the resistance is greater than or less than the preselected value.

In accordance with the invention, it has been found that the normally unrelated, and generally considered incompatable, Linear type and N-Squared type searching philosophies before-mentioned, can be combined to produce a synergestic and unexpected dramatic reduction in test requirements.

In the preferred or best mode of operation of the invention, two sequences of tests are performed. In the first sequence of tests, one lead of the short detector is connected to one node of the device being tested, and the other lead of the short detector is connected to all other nodes of the plurality of nodes of the device, simultaneously or concurrently. This is successively repeated for every node; thus requiring, for N nodes, N tests. Whenever a short is detected, the index of the node being individually connected is noted. At this point, therefore, while it is known that such nodes are shorted to some other nodes, it is not known to which other nodes.

The invention then turns to the carrying out of the second sequence of tests, in which one lead of the short detector is connected to one shorted node found and identified in the previous sequence of tests, and the other lead of the short detector is connected to successive ones of each of the identified shorted nodes. This is repeated for each pair of such shorted nodes requiring, for M shorted nodes, M(M-1)/2 tests. Whenever a short is detected, the indices of the nodes comprising the node pair being tested are noted for reporting or indicating as a shorted node pair.

The startling reduction in tests required by the invention to find the shorted node pairs, over the number of tests required in the past with the N-Squared type searching, (the Linear searching being incapable of determining the shorted node pairs) is demonstrated by the following table:

| Number of Nodes N | Number of Tests Required by Prior Art N-Squared Search | Number of Tests Required by Present Invention | | | | |
|---|---|---|---|---|---|---|
| | | $M = 0$ | $M = 2$ | $M = 4$ | $M = 6$ | $M = 8$ |
| 64 | 2016 | 64 | 65 | 70 | 79 | 92 |
| 128 | 8128 | 128 | 129 | 134 | 143 | 156 |
| 256 | 32640 | 256 | 257 | 262 | 271 | 284 |
| 512 | 130816 | 512 | 513 | 518 | 527 | 540 |
| 1024 | 523776 | 1024 | 1025 | 1030 | 1039 | 1052 |
| 2048 | 2096128 | 2048 | 2049 | 2054 | 2063 | 2076 |

As described before, the so-called "Terminating N-Squared" search requires fewer tests when shorts are actually present. Since, in the method of the invention, all nodes found in the first step are involved in shorts, it is therefore particularly efficient to use the terminating version of the N-Squared search in the second sequence of tests of the invention. If that is done, the numbers in the columns of the above table for $M=2$ and higher will be even smaller than those shown; with the exact number of tests required depending upon the specific locations of the shorts and being thus not specifiable.

Further modifications will also occur to those skilled in this art, and such are considered to fall within the spirit and scope of the invention as defined in the appended claims.

What is claimed is:

1. A method of reducing the number of tests required to detect shorts and the like between nodes of an apparatus under test, the apparatus having a plurality of such nodes, and to identify shorted nodes, the method including a first sequence of tests in which shorted nodes are detected and, in the event that shorted nodes are detected, a second sequence of tests to identify shorted node pairs, the method comprising the steps of successively selecting an individual node of said plurality and connecting together the remaining nodes of said plurality in a group; testing for a short between each individual selected node and the group of the remaining connected nodes; detecting during said testing those individual nodes which are shorted to one or more other nodes of the group; and thereafter, in the event that shorted nodes are detected, testing for a short between each detected shorted node and each of the other detected shorted nodes to identify shorted node pairs.

2. The method of claim 1 further comprising, upon identifying a shorted node pair, the step of successively testing for a short between a next-detected individual shorted node and each of the remaining detected individual shorted nodes, excluding from said testing nodes of previously identified shorted node pairs, to identify a further shorted node pair.

3. In a short detector system and the like having a short detector with a pair of leads, means for connecting the leads to nodes of an apparatus under test, the apparatus having a plurality of such nodes, and means for indicating a short between nodes connected to said leads, a method of operating the short detector system to reduce the number of tests required to detect and to identify shorted nodes, the method comprising the steps of successively connecting one lead to each individual node of said apparatus under test while concurrently connecting the other lead to all of the remaining nodes to connect said remaining nodes together in a group; detecting those individual nodes which are shorted to one or more nodes of the group; and thereupon, in the event that shorted nodes are detected, connecting each detected shorted node to a first one of the pair of leads while connecting the other lead successively to each of the other detected shorted nodes to identify shorted node pairs.

4. The method of claim 3 further comprising, upon identifying a shorted node pair, the step of connecting the first one of the pair of leads to a next-detected shorted node, and thereupon connecting the other lead successively to each of the other detected shorted nodes, excluding nodes of previously identified shorted node pairs, to identify a further shorted node pair.

* * * * *